United States Patent [19]
Watanabe et al.

[11] Patent Number: 5,172,330
[45] Date of Patent: Dec. 15, 1992

[54] CLOCK BUFFERS ARRANGED IN A PERIPHERAL REGION OF THE LOGIC CIRCUIT AREA

[75] Inventors: Hiroyuki Watanabe, Tokyo; Chikahiro Hori, Yokohama, both of Japan

[73] Assignee: Kabushiki Kaisha Toshiba, Kawasaki, Japan

[21] Appl. No.: 473,034

[22] Filed: Jan. 31, 1990

[30] Foreign Application Priority Data

Feb. 8, 1989 [JP] Japan .................. 1-029190

[51] Int. Cl.⁵ .............. G06F 15/60; H03K 19/01
[52] U.S. Cl. .................. 364/491; 364/490; 307/480; 307/482.1
[58] Field of Search .............. 364/488, 489, 490, 491; 307/480, 482.1, 303, 303.1, 269, 270

[56] References Cited

U.S. PATENT DOCUMENTS

| | | | |
|---|---|---|---|
| 4,661,721 | 4/1987 | Ushiku | 307/480 |
| 4,812,684 | 3/1989 | Yamagiwa et al. | 307/480 |
| 4,857,765 | 8/1989 | Cahill et al. | 307/480 |
| 4,958,092 | 9/1990 | Tanaka | 307/480 |
| 5,012,427 | 4/1991 | Kuribayashi | 307/480 |
| 5,013,942 | 5/1991 | Nishimura et al. | 307/480 |

*Primary Examiner*—Vincent N. Trans
*Attorney, Agent, or Firm*—Foley & Lardner

[57] ABSTRACT

In designing an integrated circuit having a logic circuit area and a clock supplying circuit, the layout of the clock supplying circuit can be designed before the completion of the layout designing of the logic circuit area. Clock buffers and wires that are component elements of the clock supplying circuit are arranged in a peripheral region of the logic circuit area. This arrangement enables the layout designing of the clock supplying circuit to be done with no influence of the layout designing of the logic circuit area.

22 Claims, 12 Drawing Sheets

CLOCK BUFFERS ARRANGED IN A PERIPHERAL REGION OF THE LOGIC CIRCUIT AREA

BACKGROUND OF THE INVENTION

1. Field of the Invention L The present invention relates to an integrated circuit, and particularly to an integrated circuit in which the layout designing of a clock supplying circuit of the integrated circuit can be started independently of the layout designing of a logic circuit area of the integrated circuit.

2. Description of the Prior Art

Figure 1:
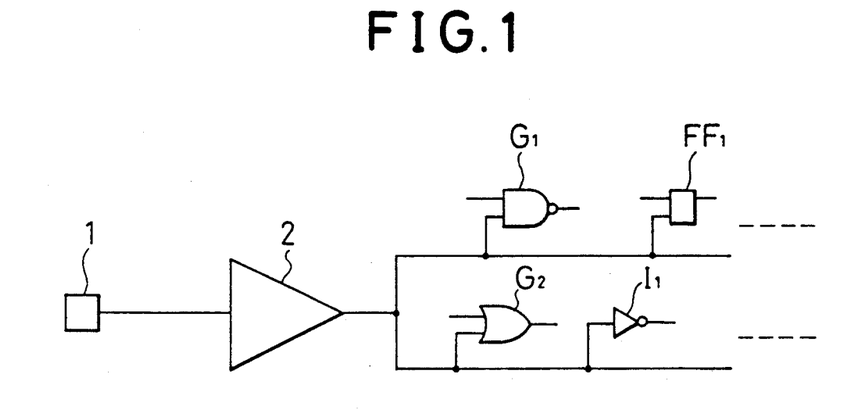
FIG. 1 is a circuit diagram showing a clock supplying circuit according to a prior art.

For a conventional small scale integrated circuit, a single clock buffer having a large driving capability may be sufficient to supply clock signals for various loads such as gates and flip-flops connected to an output of the clock buffer. FIG. 1 shows a conventional clock supplying system for such a small scale integrated circuit. In the figure, a clock input pad 1 is connected to a single buffer 2 having a large driving capability for supplying clock signals for gates G1 and G2, a flip-flop FF1, an inverter I1, etc.

Figure 2:
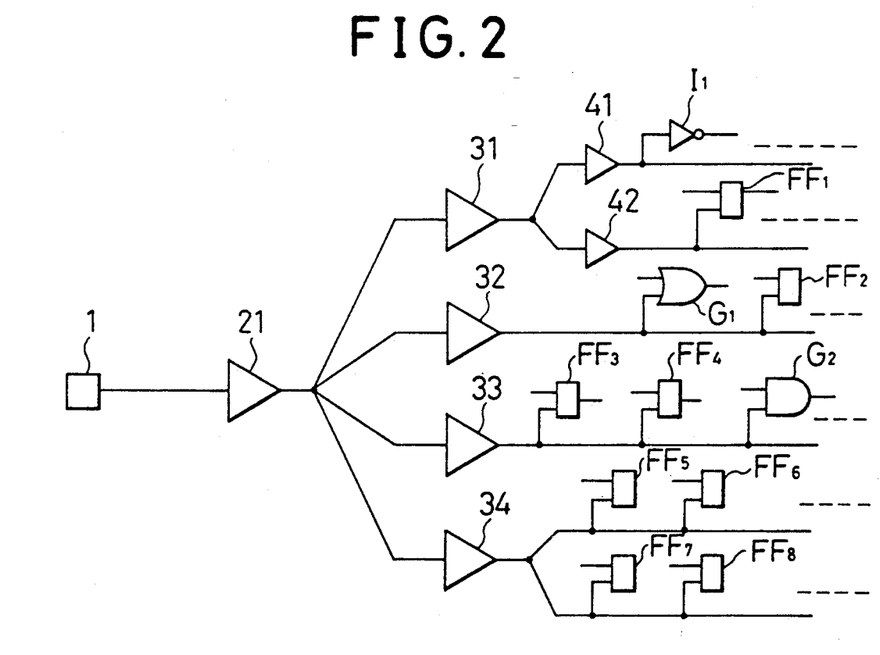
FIG. 2 is a circuit diagram showing a clock dividing and supplying system according to a prior art.

As the scale of integration of a circuit expands, it will be difficult for a single buffer to drive all loads connected to the buffer. To deal with this problem, an integrated circuit having a clock driving and supplying system shown in FIG. 2 has been developed. In the figure, a plurality of buffers 21, 31 to 34, 41 and 42 are arranged in a tree shape. The first-level buffer 21 drives the second-level buffers 31 to 34, which drive the buffers 41 and 42 of lower levels. Through these buffers, clock signals are supplied to loads such as gates G1 and G2 and flip-flops FF1 to FF8 connected to the buffers. In designing an integrated circuit employing such a clock dividing and supplying system, however, there is no established method where the buffers should be placed in the integrated circuit.

Figure 3:
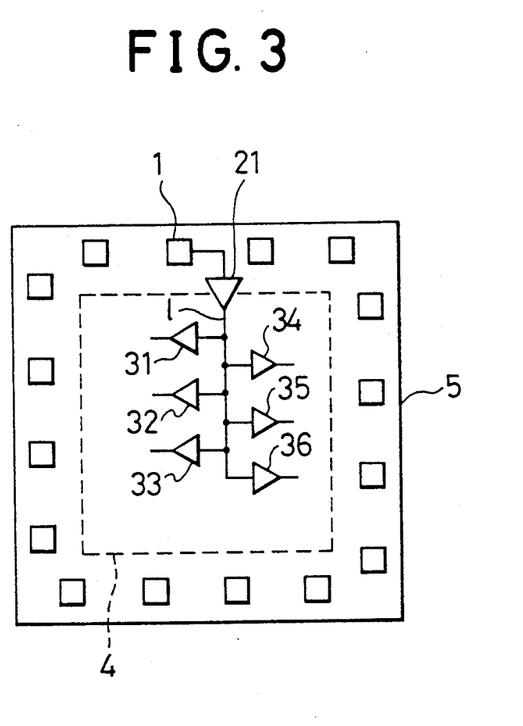
FIG. 3 is a view showing the layout of a clock dividing and supplying system according to a prior art.

For example, an integrated circuit 5 of FIG. 3 has second-level buffers 31 to 36 placed in a logic circuit area 4 adjacent to circuit elements that require clock signals. Since the second-level buffers 31 to 36 are placed in the logic circuit area 4, the path of a wire l for connecting a first-level buffer 21 with the second-level buffers 31 to 36 cannot be determined until the layout of the logic circuit area 4 is completely designed. This raises a problem that the layout designing of a clock supplying circuit of correct drive timing cannot be started until the layout designing of the logic circuit area 4 is completed.

SUMMARY OF THE INVENTION

To solve the above problem, an object of the present invention is to provide an integrated circuit employing a clock dividing and supplying system, which allows the layout designing of a clock supplying circuit to be started before or in parallel with the layout designing of a logic circuit area of the integrated circuit.

In order to accomplish the object, an integrated circuit according to the present invention comprises a clock supplying circuit and a logic circuit area to which clock signals are supplied from the clock supplying circuit. The clock supplying circuit includes an input pad, a first-level buffer whose input side is connected to the input pad, and second-level buffers connected to the output side of the first-level buffer. The first- and second-level buffers and wires for connecting the first-level buffer with the second-level buffers are arranged in a peripheral region of the logic circuit area of the integrated circuit.

Since the first-level buffer and the second-level buffers driven by the first-level buffer are placed and wired in the peripheral region of the logic circuit area, the layout designing of the buffers is not affected by the layout designing of the logic circuit area. Namely, the buffers may be arranged without waiting for the completion of the layout designing of the logic circuit area. In other words, the layout designing of the clock supplying circuit and that of the logic circuit area may be achieved in parallel, thereby shortening a designing period of the clock supplying circuit for supplying clock signals of correct timing.

These and other objects, features and advantages of the present invention will be more apparent from the following detailed description of preferred embodiments in conjunction with the accompanying drawings.

DETAILED DESCRIPTION OF THE EMBODIMENTS

Figure 4:
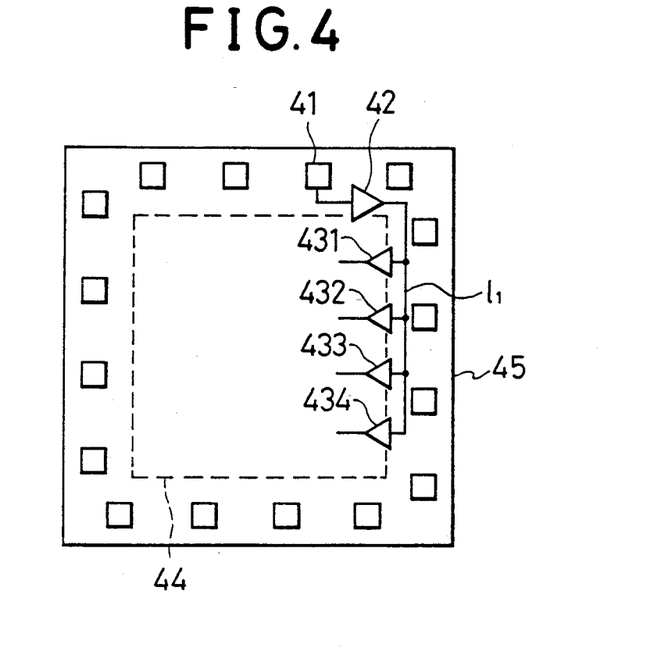
FIG. 4 is a schematic view showing the basic layout and wiring of a first embodiment of the invention.

FIG. 4 is a schematic view showing the basic layout and wiring of an integrated circuit 45 according to the first embodiment of the invention.

In the figure, an input side of a first-level buffer 42 is connected to an input pad 41. The pad 41 is a region including a bonding area connected to an external terminal, an electrostatic destruction protective circuit, a buffer, etc. An output end of the first-level buffer 42 is connected to respective second-level buffers 431 to 434. The buffers constitute a clock supplying circuit for supplying clock signals to a logic circuit area 44. In a peripheral region of the logic circuit area 44, the first-level buffer 42 and the second-level buffers 431 to 434 are placed and wired through a wire 11.

Since the first-level buffer 42 and the second-level buffers 431 to 434 driven by the first-level buffer 42 are placed and wired in the peripheral region of the logic circuit area 44, the layout of the clock supplying circuit is not affected by the layout of internal elements of the logic circuit area 44.

Generally, the peripheral region of a logic circuit area of an integrated circuit does not involve many circuit elements. Clock buffers and clock wires may, therefore, be freely arranged in the peripheral region.

Figure 5:
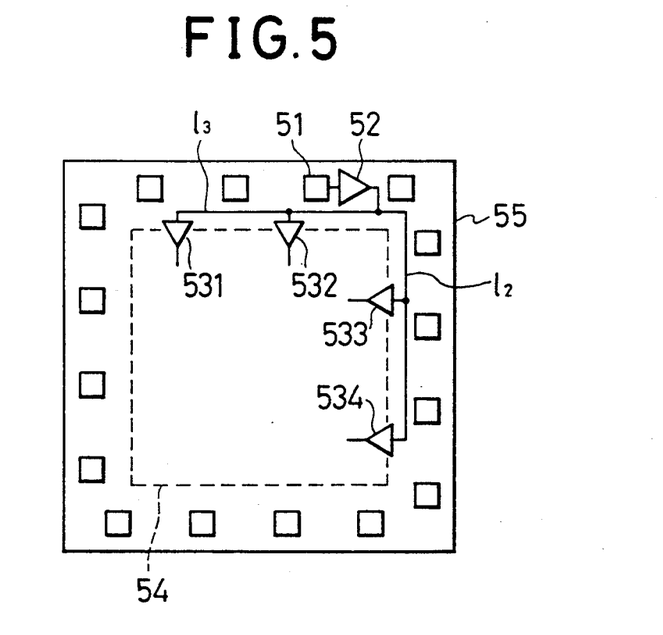
FIG. 5 is a schematic view showing the layout and wiring of a second embodiment of the invention.

FIG. 5 shows an integrated circuit according to the second embodiment of the invention. In this embodiment, a first-level buffer 52 is disposed in the vicinity of an input pad 51, and second-level buffers 531 to 534 are disposed in a peripheral region along two sides of a logic circuit area 54. Clock wires 12 and 13 connect the first-level buffer 52 with the second-level buffers along the two sides, respectively.

Figure 6:
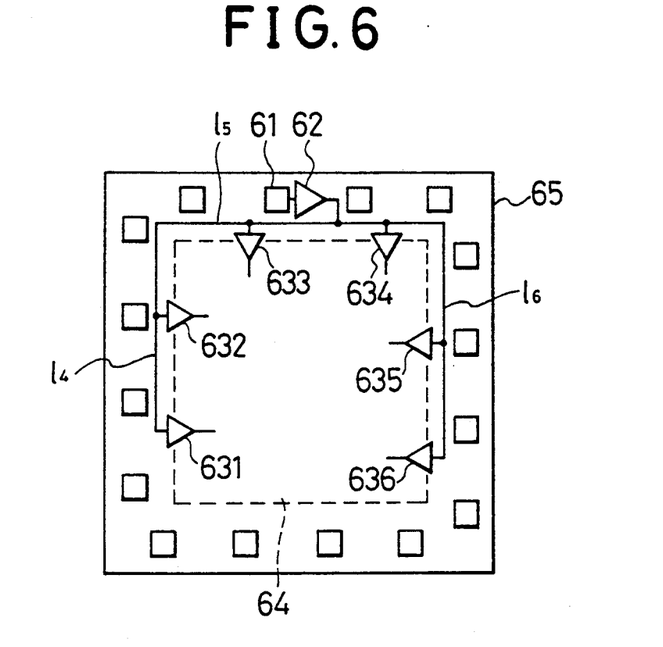
FIG. 6 is a schematic view showing the layout and wiring of a third embodiment of the invention.

FIG. 6 is a schematic view showing an integrated circuit according to the third embodiment of the invention. In this embodiment, second-level buffers 631 to 636 are disposed along three sides of a logic circuit area 64. Wires 14, 15 and 16 connect a first-level buffer 62 with the second-level buffers along the three sides, respectively.

Figure 7:
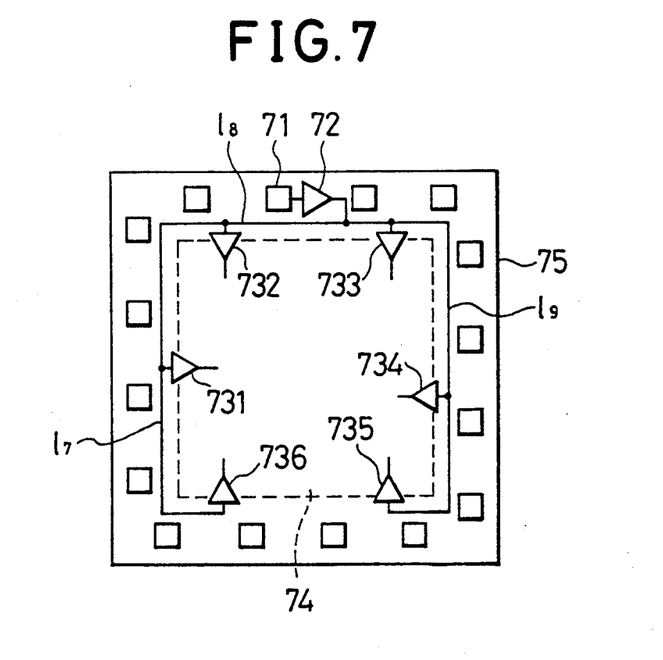
FIG. 7 is a schematic view showing the layout and wiring of a fourth embodiment of the invention.

FIG. 7 is a view showing an integrated circuit according to the fourth embodiment of the invention. In this embodiment, second-level buffers 731 to 736 are disposed along four sides of a logic circuit area 74. Wires 17, 18 and 19 connect a first-level buffer 72 with the second-level buffers along the four sides, respectively.

Figure 8:
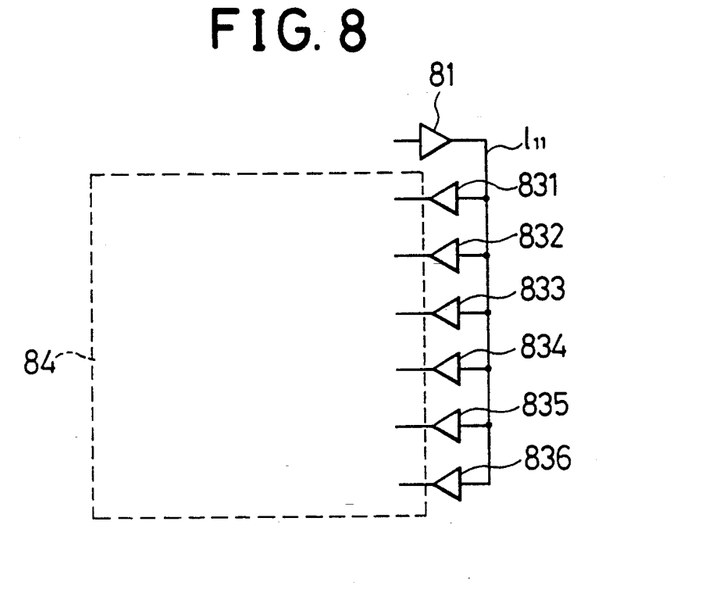
FIGS. 8, 9 and 10 are schematic views showing the layout and wiring of fifth, sixth and seventh embodiments of the invention, respectively.
Figure 9:
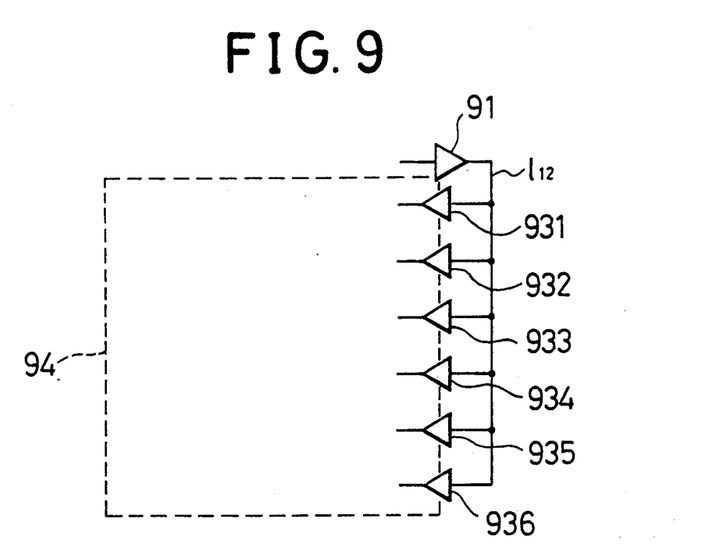
Figure 10:
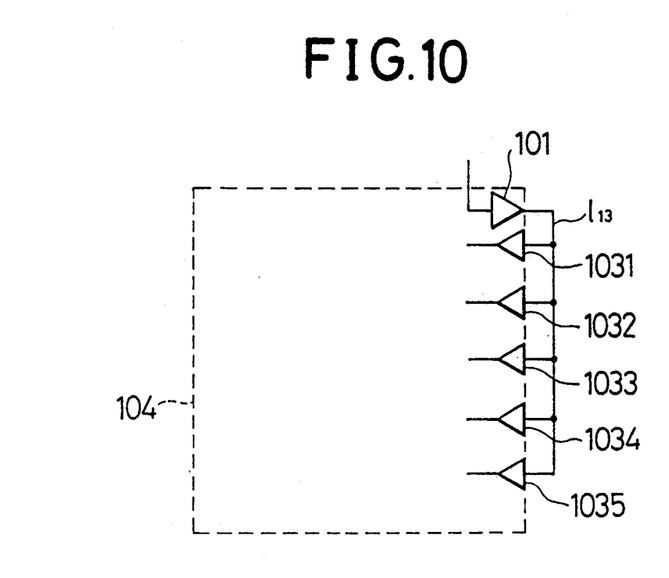

FIGS. 8, 9 and 10 are views showing integrated circuits according to the fifth, sixth and seventh embodiments of the invention, respectively. The figures mainly show logic circuit areas and peripheral regions thereof. In the figures, input pads and external frames of the integrated circuits are omitted. The figures show the positional relationship of first-level buffers 81, 91 and 101, second-level buffers 831 to 836, 931 to 936 and 1031 to 1035, as well as showing the relative positions of the buffers and logic circuit regions 84, 94 and 104.

In the embodiment of FIG. 8, the second-level buffers 831 to 836 are located outside the logic circuit area 84.

In the embodiment of FIG. 9, the second-level buffers 931 to 936 are located on a boundary of the logic circuit area 94. In the embodiment of FIG. 10, the second-level buffers 1031 to 1035 are located inside a boundary of the logic circuit area 104.

In any of the embodiments, the designing of wires extending from a first-level buffer to second-level buffers is not substantially affected by the layout designing of a logic circuit region. Accordingly, the designing of a clock supplying circuit can be started before the completion of the layout designing of the logic circuit region.

Figure 11:
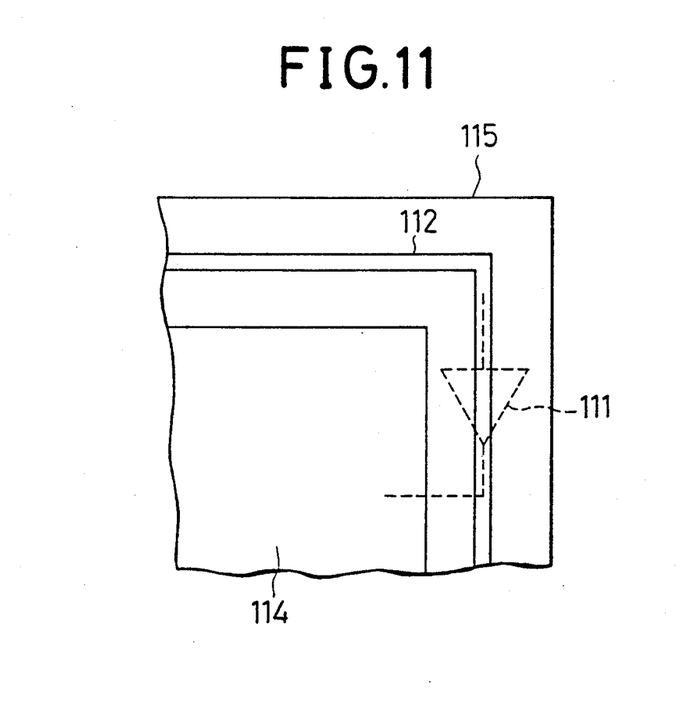
FIG. 11 is a schematic view showing the layout and wiring of an eighth embodiment of the invention, particularly showing a construction of a pair of power source line and a buffer.

FIG. 11 is a partial view showing an integrated circuit according to the eighth embodiment of the invention. In this embodiment, a buffer 111 is disposed below a power source line 112. The power source line 112 wider than a standard signal line is frequently disposed on the periphery of a logic circuit area 114. By embedding the buffer 111 under the power source line 112, an area of the integrated circuit may be reduced in comparison with the case of juxtaposing the power source line 112 and buffer 111.

Figure 12:
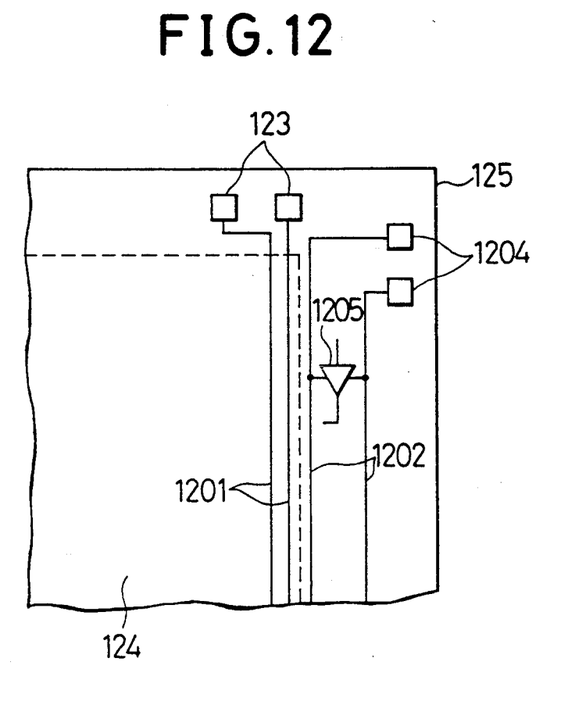
FIG. 12 is a schematic view showing the layout and wiring of a ninth embodiment of the invention.

FIG. 12 is an integrated circuit according to the ninth embodiment as application of the invention. In this embodiment, power source lines 1201 for a logic circuit area 124 are separated from power source lines 1202 for a clock buffer 1205 on an integrated circuit substrate 125. Electric power for the logic circuit area 124 is supplied from a power source pad 123 for the logic circuit area 124 through the electric power source lines 1201. Electric power for the clock buffer 1205 arranged on the periphery of the logic circuit area 124 is supplied from a power source pad 1204 that is different from the power source pad 123, through the power source lines 201. Since the power source lines 1201 and the power source lines 1202 are not connected with each other on the integrated circuit substrate 125, noise on the power source lines 1202 caused by the clock buffer 1205 is not transferred to the power source lines 1201 for the logic circuit area 124, so that logic circuit elements disposed in the logic circuit area 124 may not be erroneously operated by the noise caused by the clock buffer 1205. Further, noise on the power source lines 1201 caused in the logic circuit area 124 does not influence the operation of the clock buffer 1205.

If power source noise caused by a first-level buffer is large and if power source noise caused by second-level buffers is small, it is possible to separate only a power source for the first-level buffer from a power source for a logic circuit area. On the contrary, if the power source noise due to the second-level buffers is larger than that caused by the first-level buffer, only a power source for the second-level buffers may be separated from the power source for the logic circuit area. It is also possible to separate either of a high-potential power source line or a low-potential power source line from the power source for the logic circuit area, while the other is connected thereto.

Figure 13:
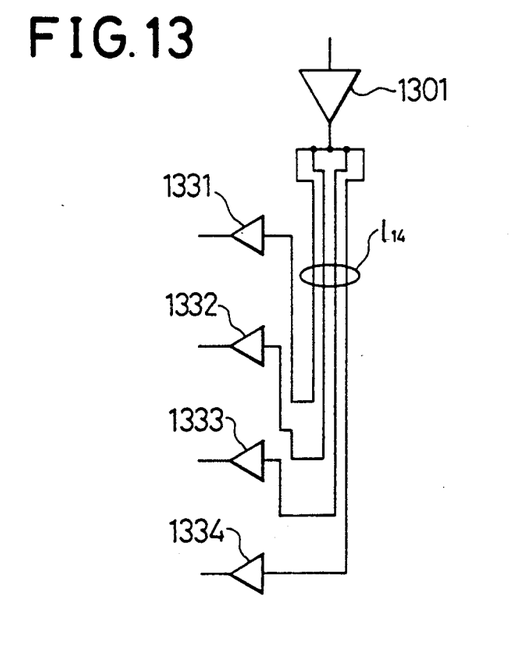
FIG. 13 is a schematic view showing the layout and wiring of a tenth embodiment of the invention with clock supplying wires of an equal length.

FIG. 13 is a view showing the tenth embodiment of the invention. In this embodiment, wires 114 extending from a first-level buffer 1301 to the second-level buffers 1331 to 1334 have the same length. With this arrangement, the same clock delay occurs between the first-level buffer 1301 and each of the second-level buffers 1331 to 1334 so that no clock time difference may occur between the second-level buffers. The first-level buffer 1301 and the second-level buffers 1331 to 1334 are placed in a peripheral region of a logic circuit area (not shown), so that the paths of the wires 114 are not affected by the layout designing of elements disposed inside the logic circuit area. Since the peripheral region of the logic circuit area involves only a small number of circuit elements, the lengths of the wires 114 may easily be adjusted and equalized to each other. Even if the lengths of the wires 114 are not completely equalized, it is possible to adjust the wires 114 to optimum lengths for suppressing clock time differences within an allowable range of the logic circuit.

Figure 14:
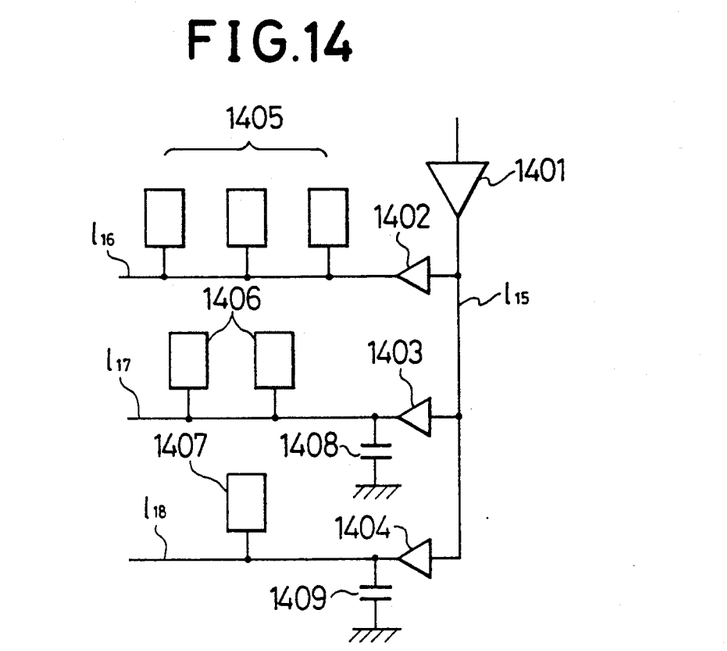
FIG. 14 is a schematic view showing a clock supplying circuit with load adjusting capacitors according to an eleventh embodiment of the invention.

FIG. 14 is a view showing the eleventh embodiment of the invention. In this embodiment, each of second-level buffers 1402 to 1404 has the same driving capability. If the total capacitance of a load 1405 and a wire 116 driven by the buffer 1402, the total capacitance of a load 1406 and a wire 117 driven by the buffer 1403, and the total capacitance of a load 1407 and a wire 118 driven by the buffer 1404 differ from one another, load adjusting dummy capacitors 1408 and 1409 may be added to the buffers to equalize the loads on the respective buffers 1402 to 1404. The second-level buffers 1402 to 1404 are then designed as buffers of the same capability to simplify the designing of a clock supplying circuit.

It is also possible to consider a large margin in estimating total loads to be driven by the second-level buffers, and, after the total loads of the second-level buffers are correctly determined upon the completion of the layout designing of the logic circuit area, adjusting capacitors are properly added to the second-level buffers to equalize the loads on the second-level buffers. This further enables the designing of the clock supplying circuit not to be affected by the layout designing of the logic circuit area. As a result, without waiting for the completion of the layout designing of the logic circuit area, the designing of the clock supplying circuit can be started.

Figure 15:
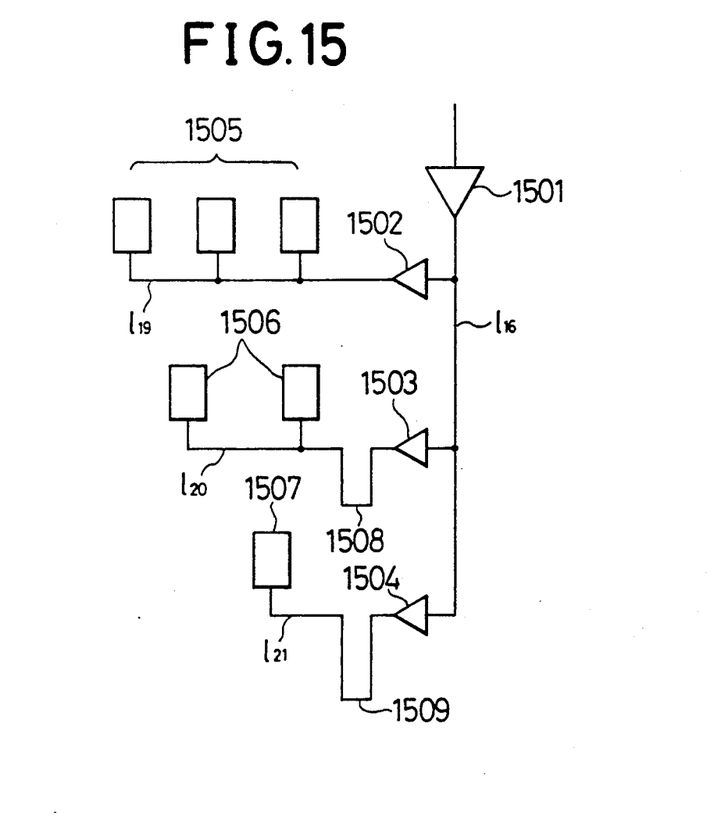
FIG. 15 is a schematic view showing a clock supplying circuit with detoured wires according to a twelfth embodiment of the invention.

FIG. 15 is a view showing the twelfth embodiment of the invention. In this embodiment, second level buffers 1502, 1503 and 1504 have different loads 1505, 1506 and 1507, respectively. To cancel the difference in the loads and prevent a clock timing deviation to occur, detouring wires 1508 and 1509 are disposed on the output sides of the second-level buffers 1503 and 1504 for adjusting to equalize loads. The detouring wires 1508 and 1509 may be disposed inside a logic circuit area or outside the logic circuit area.

The dummy load capacitors 1408 and 1409 shown in FIG. 14 and the detouring wires 1508 and 1509 shown in FIG. 15 may be employed together to more correctly adjust the clock timing.

Figure 16:
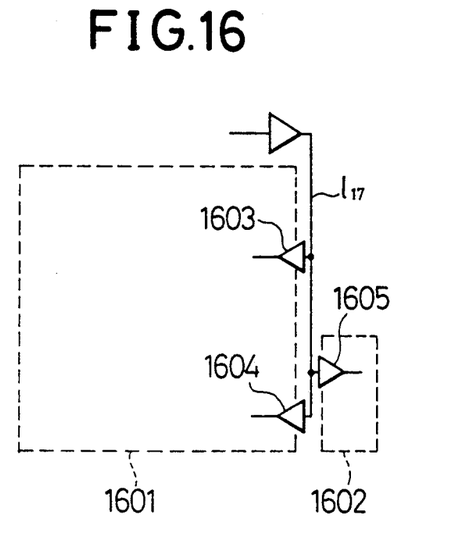
FIG. 16 is a schematic view showing a clock supplying circuit with an auxiliary logic circuit according to a thirteenth embodiment of the invention.

The previous embodiments involve only one logic circuit area. As shown in FIG. 16, the invention is applicable for a case involving a main logic circuit area 1601 and an auxiliary logic circuit area 1602. Second-level buffers 1603 and 1604 are disposed on the periphery of the main logic circuit area 1601, and a second level buffer 1605 is disposed on the periphery of the auxiliary logic circuit area 1602. All the second-level buffers 1603 to 1605 may be arranged with no influence of the layout of the main and auxiliary logic circuit areas 1601 and 1602.

As explained above, by arranging first and second buffers on the periphery of a logic circuit area in a clock dividing and supplying system according to the invention, the designing of a clock supplying circuit can be started before or in parallel with the layout designing of the logic circuit area. The invention also provides an effect that the second level buffers are almost manufactured same driving during the manufacturing process. This effect will be explained with reference to FIG. 17 in which a second-level buffer is formed of a MOS transistor.

Figure 17:
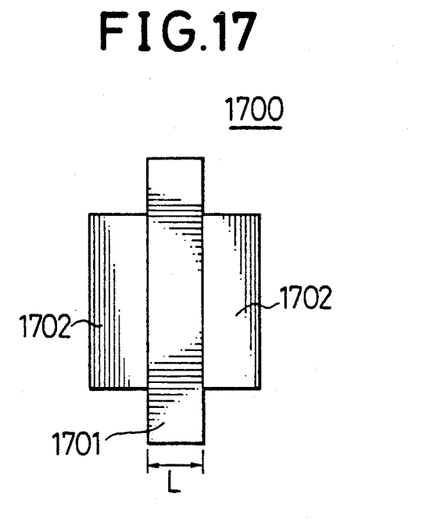
FIG. 17 is a schematic view showing a MOS transistor.

FIG. 17 shows the structure of a MOS transistor 1700, which comprises a gate electrode 1701 and a diffusion region 1702. The driving capability of the MOS transistor 1700 is determined by a gate length L. It is unavoidable, however, the gate length L deviates from a set length during the manufacturing process. If second-level buffers disposed on a chip have different gate lengths respectively, the driving capabilities of the second-level buffers may differ from one another to fluctuate clock signals outputted from the second-level buffers. Namely, if the driving capability of a second-level buffer is large, a clock signal outputted from the buffer will be of fast timing. On the other hand, if the driving capability of a second-level buffer is small, a clock signal outputted from the buffer will be of slow timing. The deviation of the gate length L of the second-level buffer shall be, therefore, smaller as possible.

The gate length of a MOS transistor is affected by the layout of its periphery. If, however, all second-level buffers are disposed under the same conditions on the periphery of a logic circuit area, the difference of driving capability of the second-level buffers may be reduced. In addition, if the gate length of each second-level buffer is longer than the gate length of each MOS transistor disposed in the logic circuit, the influence of the gate length difference will be reduced. Generally, the gate length of a MOS transistor disposed in a logic circuit is set to be a manufacturable minimum length. Meanwhile, the influence of the gate length difference can be expressed with a value obtainable by dividing a gate length deviation by an original gate length, as follows:

gate length deviation / original gate length. If the gate length deviation is constant, the longer the original gate length, the smaller the influence of the deviation. This means that the fluctuation of clock signals may be reduced by elongating the gate length of the second-level buffer MOS transistor 1700.

Figure 18:
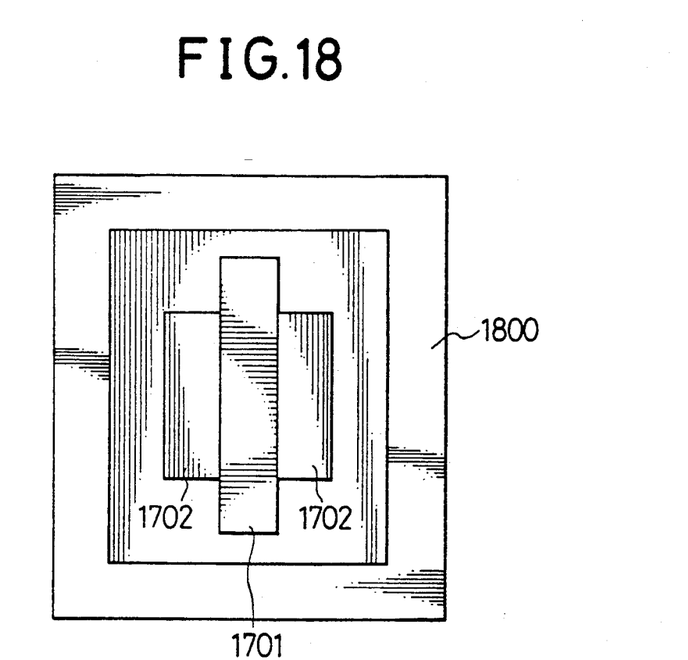
FIG. 18 is a schematic view showing a MOS transistor having an enclosure.

FIG. 18 shows an enclosure 1800 formed on the same layer of the gate 1701, to surround the MOS transistor 1700 to further reduce the influence of a deviation of the gate length.

Figure 19:
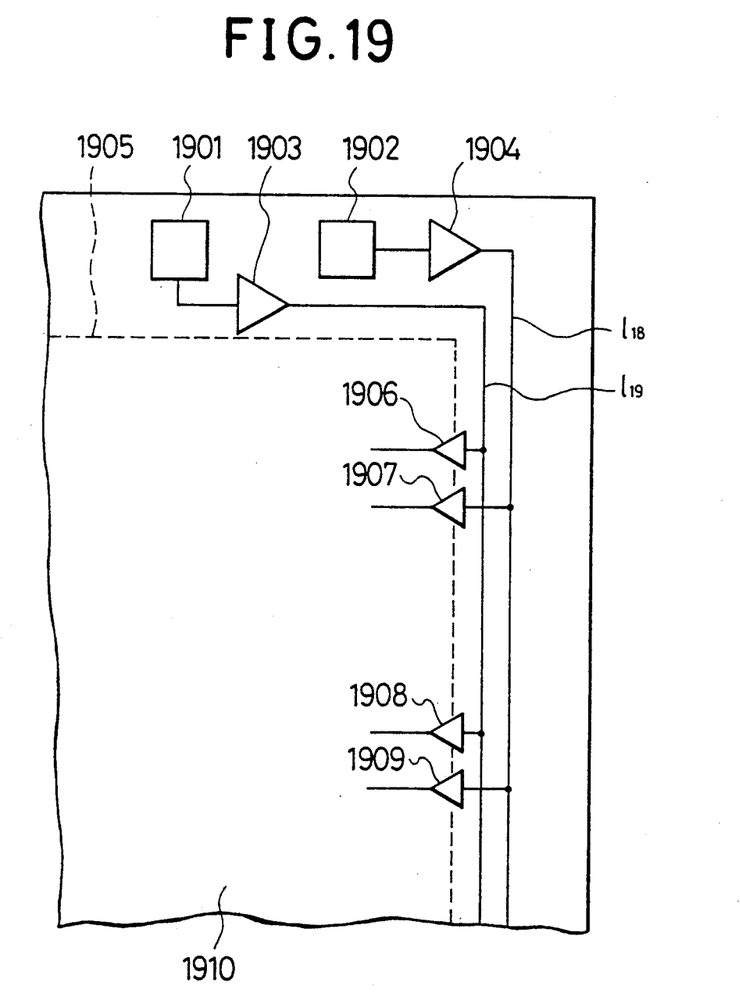
FIG. 19 is a schematic view showing the layout and wiring of two different clock supplying circuits according to a fourteenth embodiment of the invention.

FIG. 19 is a view showing the fourteenth embodiment of the invention. In this embodiment, an integrated circuit has two different clock dividing and supplying circuits. As shown in the figure, one of the clock supplying circuits comprises an input pad 1901, a first-level buffer 1903, and second-level buffers 1906 and 1908 that are connected to the first-level buffer 1903 through a wire 119. The other clock supplying circuit comprises an input pad 1902, a first-level buffer 1904, and second-level buffers 1907 and 1909 that are connected to the first-level buffer 1904 through a wire 118. The first-level buffers 1903 and 1904 and the second-level buffers 1906 to 1909 are placed and wired on the periphery of a logic circuit area 1910, independently of the logic circuit area 1910.

Figure 20:
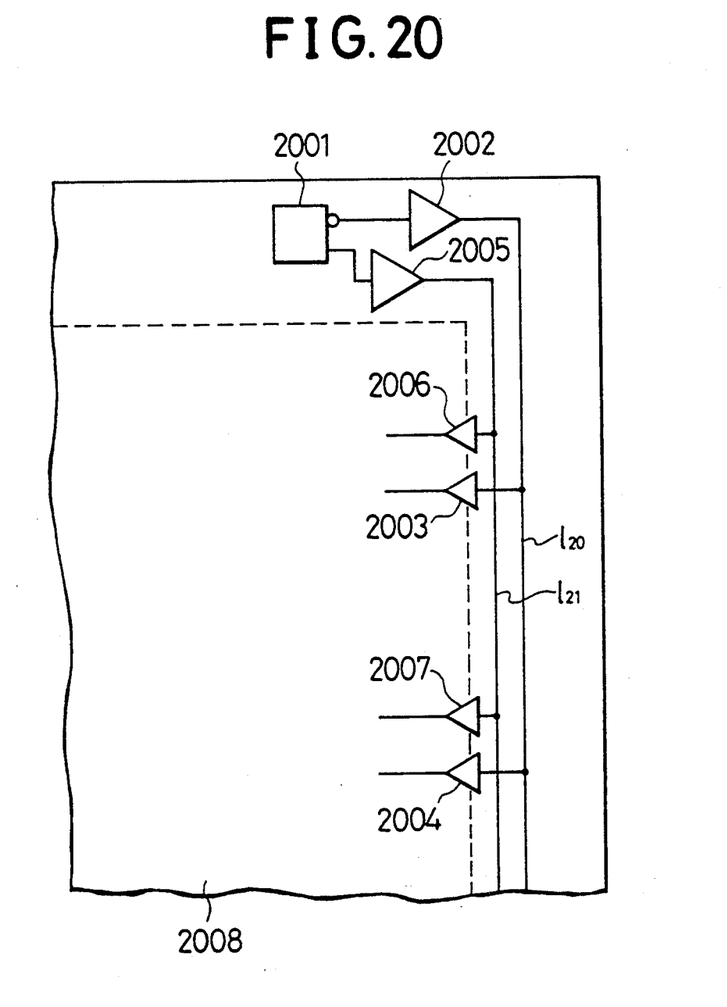
FIG. 20 is a schematic view showing the layout and wiring of a pad and two different clock systems according to a fifteenth embodiment of the invention.

FIG. 20 is a view showing the fifteenth embodiment of the invention. In this embodiment, only one kind of clock signals are supplied from the outside to two clock supplying circuits. In the figure, an input pad 2001 receives the externally supplied clock signals and supplies two kinds of clock signal to first-level buffers 2002 and 2005. The first-level buffer 2002 supplies the received clock signals to second-level buffers 2003 and 2004 through a wire 120, and the first-level buffer 2005 supplies the received clock signals to second-level buffers 2006 and 2007 through a wire 121.

In this embodiment, the first-level buffers 2002 and 2005, the second-level buffers 2003, 2004, 2006 and 2007 and the wires 120 and 121 are disposed on the periphery of a logic circuit 2008. As a result, the clock supplying circuits can be designed in parallel with the designing of the logic circuit 2008.

Figure 21:
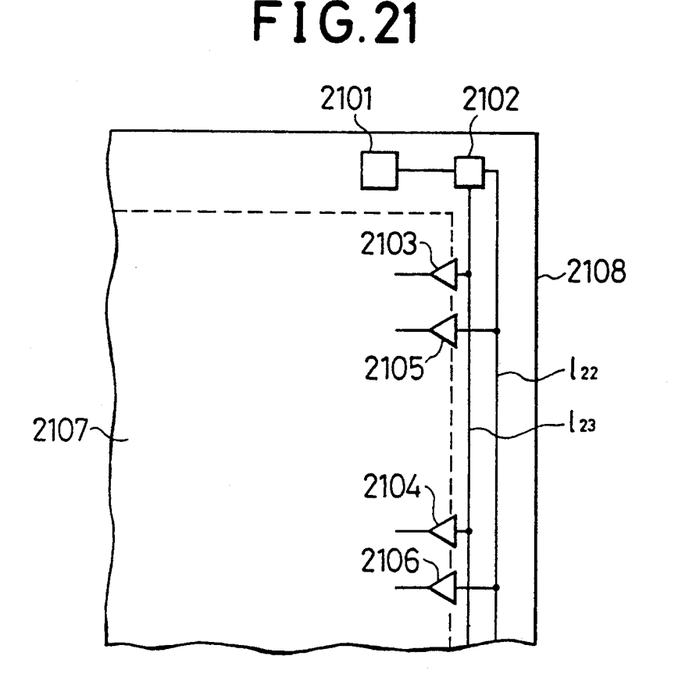
FIG. 21 is a schematic view showing the layout and wiring of a first-level buffer and two different clock systems according to a sixteenth embodiment of the invention.

FIG. 21 is a view showing the sixteenth embodiment of the invention, in which a first-level buffer 2102 supplies clock signals to two clock supplying circuits.

Figure 22:
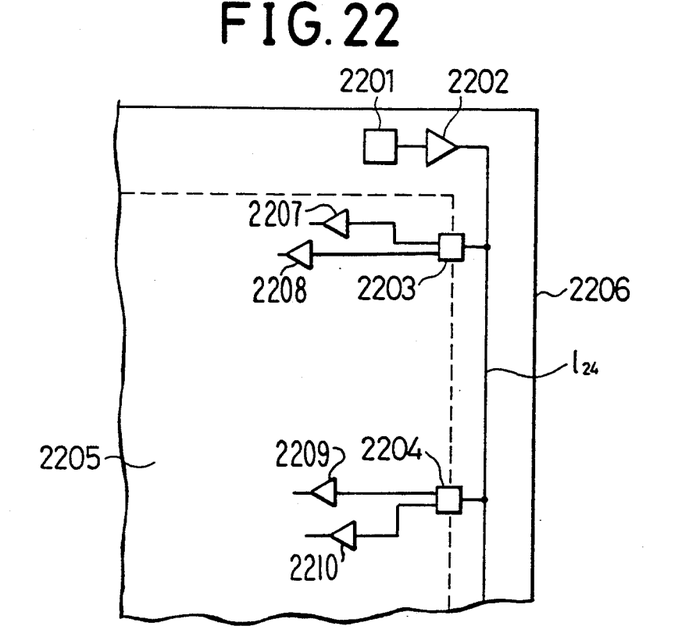
FIG. 22 is a schematic view showing the layout and wiring of second-level buffers and two different clock systems starting from each of the second-level buffers according to a seventeenth embodiment of the invention.

FIG. 22 is a view showing the seventeenth embodiment of the invention, in which each of second-level buffers 2203 and 2204 supplies clock signals for two systems of third-level buffers 2207 to 2210, gates and flip-flops (not shown). In the embodiments of FIGS. 21 and 22, the first buffer 2102, second buffers 2103 to 2106, 2203 and 2204 and clock supply wires 122, 123 and 124 are disposed on the periphery of corresponding logic circuits 2107 and 2205, so that the clock supplying circuits may be designed in parallel with the designing of the logic circuits 2107 and 2205.

Various modifications will become possible for those skilled in the art after receiving the teachings of the present disclosure without departing from the scope thereof.

What is claimed is:

1. An integrated circuit and comprising:
   a clock supplying circuit; and
   a logic circuit area to which clock signals are supplied from said clock supplying circuit;
   wherein said clock supplying circuit comprises;
   a pad for supplying said clock signals;
   a first-level buffer with an input side connected to said pad;
   a plurality of second-level buffers driven by said clock signals outputted from said first-level buffer; and
   wires connected an output of said first level buffer to inputs of said second-level buffers, wherein said first- and second-level buffers and said wires are disposed in a peripheral region around said logic circuit area.

2. An integrated circuit according to claim 1, wherein said first- and second-level buffers and said wires are arranged in said peripheral region along one side of said logic circuit area.

3. An integrated circuit according to claim 1, wherein said first- and second-level buffers and said wires are arranged in said peripheral region along two sides of said logic circuit area.

4. An integrated circuit according to claim 1, wherein said first- and second-level buffers and said wires are arranged in said peripheral region along three sides of said logic circuit area.

5. An integrated circuit according to claim 1, wherein said first- and second-level buffers and said wires are arranged in said peripheral region along all sides of said logic circuit area.

6. An integrated circuit according to claim 1, wherein said buffers arranged in said peripheral region of said logic circuit area are located under a power source line.

7. An integrated circuit according to claim 1, wherein a power source line for said logic circuit area and a power source line for said buffers are separated from each other on a substrate of the integrated circuit.

8. An integrated circuit according to claim 1, wherein:
   said second-level buffers have equal driving, capabilities; and
   dummy load capacitors are additionally connected to said second-level buffers to equalize loads on said second-level buffers, if the loads on said second-level buffers differ from one another.

9. An integrated circuit according to claim 1, wherein:
   said second-level buffers have equal driving capabilities; and
   lengths of wires coming out of said outputs of said second-level buffers are adjusted to equalize loads on said second-level buffers, if the loads on said second-level buffers differ from one another.

10. An integrated circuit according to claim 1, wherein the gate length of a MOS transistor forming said second-level buffer is longer than the gate length of a MOS transistor disposed within said logic circuit area.

11. An integrated circuit according to claim 1, wherein said wires extending from said output of said first-level buffer to said inputs of said second-level buffers are equal in length.

12. An integrated circuit, comprising:
    logic circuits;
    a logic circuit area in which said logic circuits are arranged;
    a pad arranged around a peripheral region of said integrated circuit;
    clock supply means operating in at least three levels for supplying clock signals to said logic circuit comprising:
    a first-level buffer comprising at least one buffer operating in a first level, with an input side connected to said pad;
    a plurality of second-level buffers operating in a second level and driven by said clock signals transferred from said first-level buffer wherein wires electrically connect an output of said first-level buffer to inputs of said second-level buffers, wherein said first-level buffer and said second-level buffers are arranged in a peripheral region around said logic circuit area; and
    a plurality of third level buffers as final-level buffers belonging to a final level operating and driven by clock signals transferred by wires from said second-level buffers.

13. An integrated circuit according to claim 12, wherein said first-level buffer, said second-level buffers, and said wires through which said first-level buffer and said second-level buffers are connected electrically are arranged in said peripheral region along one side of said logic circuit area.

14. An integrated circuit according to claim 12, wherein said first-level buffer, said second-level buffers, and said wires through which said first-level buffer and said second-level buffers are connected electrically are arranged in said peripheral region along two sides of said logic circuit area.

15. An integrated circuit according to claim 12, wherein said first-level buffer, said second-level buffers, and said wires through which said first-level buffer and said second-level buffers are connected electrically are arranged in said peripheral region along three sides of said logic circuit area.

16. An integrated circuit according to claim 12, wherein said first-level buffer, said second-level buffers, and said wires through which said first-level buffer and said second-level buffers are connected electrically are arranged in said peripheral region along all sides of said logic circuit area.

17. An integrated circuit according to claim 12, wherein said first-level buffer and said second-level buffers arranged in said peripheral region of said logic circuit area are located under a power source line.

18. An integrated circuit according to claim 12, further comprising:
a power source line for supplying electric power to said logic circuit area, wherein said first-level buffer and said second-level buffers arranged in said peripheral region of said logic circuit area are located under said power source line.

19. An integrated circuit according to claim 12, wherein:
each of said second-level buffers operating in said second level has an equal driving capability; and
dummy load capacitors are additionally connected to said second-level buffers to equalize loads of said second-level buffers when said loads on said second-level buffers differ from one another.

20. An integrated circuit according to claim 12, wherein:
each of said second-level buffers operating in said second-level has an equal driving capability; and
a length of a wire connected between each of said second-level buffers and each of said third-level buffers coming out of an output of each second-level buffer is adjusted to equalize loads on said second-level buffers to each other when said loads belonging to said second-level buffers differ from one another.

21. An integrated circuit according to claim 12, wherein the gate length of a MOS transistor forming each of said second-level buffers is longer than the gate length of a MOS transistor disposed within said logic circuit area.

22. An integrated circuit according to claim 12, wherein said wires extending from said first-level buffer to said second-level buffers are of equal length.

* * * * *